United States Patent [19]
Bach et al.

[11] Patent Number: 6,014,049
[45] Date of Patent: Jan. 11, 2000

[54] REDUCED RFI POWER PULSE MODULATOR

[75] Inventors: James Carter Bach, Carmel; John J. Baker, Kokomo; Robert Joseph Stock, Arcadia; Richard J. Szep, Peru; Gerlad A. Kilgour, Kokomo, all of Ind.

[73] Assignee: Delco Electronics Corp., Kokomo, Ind.

[21] Appl. No.: 08/431,001

[22] Filed: Apr. 28, 1995

[51] Int. Cl.[7] ................................................. H03K 5/12
[52] U.S. Cl. ............................................ 327/170; 327/379
[58] Field of Search .................................. 327/379, 170, 327/380, 381, 382, 387, 108, 365, 374, 376, 377

[56] References Cited

U.S. PATENT DOCUMENTS

| | | | |
|---|---|---|---|
| 4,216,392 | 8/1980 | Valkestijn | 327/365 |
| 5,406,136 | 4/1995 | Kondoh et al. | 327/108 |

OTHER PUBLICATIONS

Sedra & Smith, Microelectronic Circuits, Saunders College Publishing 1991 Philadelphia, pp. 434–436.

Gray & Meyer, Analysis & Design of Analog Integrated Circuits, John Wiley & Sons, Inc. 1993 New York, pp. 215–217 Sedra & Smith, Microelectronic Circuits, Saunders College Publishing 1991 Philadelphia, pp. 241–243.

*Primary Examiner*—Jeffrey Zweizig
*Attorney, Agent, or Firm*—Jimmy L. Funke

[57] ABSTRACT

A modulator has an FET output driver for applying repetitive pulses to an inductive load. A predriver comprises a resistor and capacitor in parallel across the FET source and gate for shaping the control voltage. A constant current source, turned on and off by an input signal, couples the shaping circuit to ground. The resistor and capacitor values determine the rate of control voltage change which is the same for turn-on and turn-off, to control the driver current slew rate for minimizing RFI emissions.

5 Claims, 2 Drawing Sheets

REDUCED RFI POWER PULSE MODULATOR

FIELD OF THE INVENTION

This invention relates to a modulator having a repetitive pulse output and particularly to such a modulator having a large dynamic range of duty cycle and low electromagnetic emissions.

BACKGROUND OF THE INVENTION

Automotive vehicles have a number of electronically controlled actuators which comprise inductive loads supplied by pulse width modulated current. These are, for example, solenoids for hydraulic pressure control in transmissions, motors for throttle positioning, and for fuel pumps which vary fuel line pressure. The average inductive load current is controlled by the duty cycle of the modulator output. Duty cycle is adjusted by changing the width of pulses supplied at a constant frequency or even by changing the frequency of pulses having constant width. In either case, the current through the inductive load is continuous but undulating gradually in response to each pulse as it is turned on or off.

FIG. 1 of the drawings shows a conventional modulator 10 coupled to the high side of an inductive load 12. A vehicle battery 14 supplies power to the modulator 10 containing an output driver 16 comprising a power FET in series with the load 12. The modulator 10 meters current to the load, turning on and off according to the desired duty cycle. When the driver is turned on, a current path $I_D$ includes the battery, the driver and the load. A recirculation diode 18 across the load establishes current path $I_R$ which allows continuation of load current when the driver is off. Thus while the load current is somewhat continuous, the path $I_D$ current flows in pulses and is subject to being turned on and off abruptly. The current discontinuities give rise to radio frequency interference (RFI) and, since the conduction path between the battery 14 and the load may be long enough to serve as an undesired antenna, there is ample opportunity for radiation of the RFI. Such RFI results in broad-band noise which is picked up by the vehicle AM radio and especially effects the lower end of the AM band.

To improve the RFI (noise) condition, a predriver circuit 20 shapes the control signal to the driver 16 in order to shape the turn-on and turn-off waveforms of the $I_D$ current. The predriver 20 includes a waveshaping circuit 22 and an input circuit 24 which is a transistor switch triggered by a pulsed input signal. The junction or node 26 of the input and waveshaping circuits is connected to the control electrode or gate of the driver 16 and the signal developed at the node is thus the control signal of the driver. The waveshaping circuit 22 comprises a resistor 28 and a capacitor 30 in parallel connected between supply line 32 carrying the battery voltage and the node 26. The input circuit 24 comprises a transistor 34 having its base coupled to the input terminal 36 via a resistor 38 and to ground via a resistor 40, its collector connected through a resistor 42 to the node 26 and the emitter is grounded. A Zener diode 44 is connected between the supply line 32 and the node 26 for over-voltage protection of the driver FET's gate input.

The automotive battery voltage is subject to a wide range of variation and the modulator is required to be operative over a wide range of about 7.5 to 26.5 volts. The pulsed input signal causes the transistor 34 to switch between off and saturation. When the transistor 34 is in saturation the steady state control voltage at the node 26 is determined by the battery voltage and the ratio of the resistors 28 and 42. To assure that the gate-to-source voltage $V_{GS}$ of the FET driver 16 is sufficient at low battery voltage to turn on the driver, the resistor ratio must be large, say, 10:1.

When the transistor 34 turns on, the node 26 is initially at battery voltage and $V_{GS}$ is zero. The capacitor 30 charges through resistor 42 and transistor 34 to gradually increase $V_{GS}$. The FET begins to turn on when a $V_{GS}$ threshold is attained and passes through an ohmic region for further increases of $V_{GS}$ to gradually increase conduction of the driver and then the driver reaches saturation. Thus the current in path $I_D$ turns on at a slew rate which is selected by choosing the capacitor 30 and the resistor 42 to yield a fast time constant or charge rate. When the transistor turns off, the capacitor 30 discharges through resistor 28. Since resistor 28 is ten times larger than resistor 42 the time constant will be ten times larger, causing the turn-off event to proceed at a much slower rate. Two consequences of such waveshaping is that there is a time delay between the input pulse rising edge and the onset of FET conduction, and there is a transition time due to the gradual current increase. When the turn-off time constant is short enough to provide acceptable time delays, the turn-on time constant is too short, causing an abrupt current turn-on, and thus generating RFI.

Referring to FIG. 2, an example is shown where the control voltage $V_{GS}$ rises rapidly to yield a small turn-on delay of the driver current $I_D$ and a steep rising edge of the current which results in current ringing. The turn-on interval is too short to be shown in the drawing. When the control pulse of $V_{IN}$ terminates, the control voltage $V_{GS}$ slowly decreases, and after a turn-off delay reaches the transition range of the FET to decrease the current $I_D$ at a desirable slew rate extending over a turn-off interval. Thus the steep current turn-on and the ringing cause RFI; if the time constants are increased to avoid the RFI at the beginning of the pulse, the turn-off delay and interval become very large to substantially stretch the current pulse. This pulse stretching reduces the duty cycle range of the modulator.

It has been proposed to modify the modulator by adding a large capacitor at the power supply input (line 32) to minimize current flow back to the battery transient. This is a partially successful solution although it is expensive. Feedback circuits for altering driver response have also been attempted, also with limited success. Feedback circuits in combination with the large capacitor have also been used. All these modifications are attempts to patch a problem rather then to remove the source of the problem.

SUMMARY OF THE INVENTION

It is therefore an object of the invention to modulate pulsed driver current over a large dynamic range while minimizing RFI. Another object is to control the time constants of a modulator to afford substantially equal slew rates at turn-on and turn-off of driver current.

The invention improves on the prior art predriver by incorporating a constant current source in place of the input switching circuit such that the capacitor charging rate when the constant current source is turned on, and the discharging rate when the source is turned off are both determined by the resistor in parallel with the capacitor and are thus equal. Selection of the capacitor and the parallel resistor values control the rate of change of the control signal and of the driver current to minimize the RFI. The turn-on and turn-off delays are nearly equal and the respective transition intervals are also nearly equal. The large dynamic range is preserved since significant pulse stretching does not occur.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
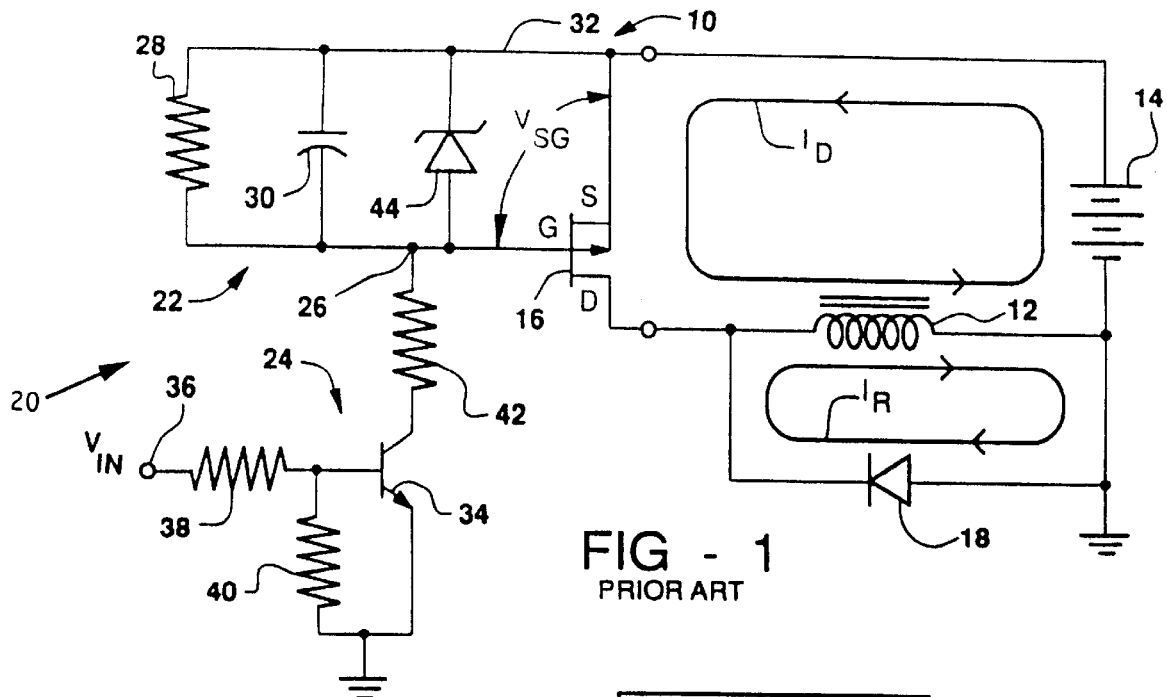
FIG. 1 is a schematic diagram of a pulsed modulator according to the prior art.
Figure 2:
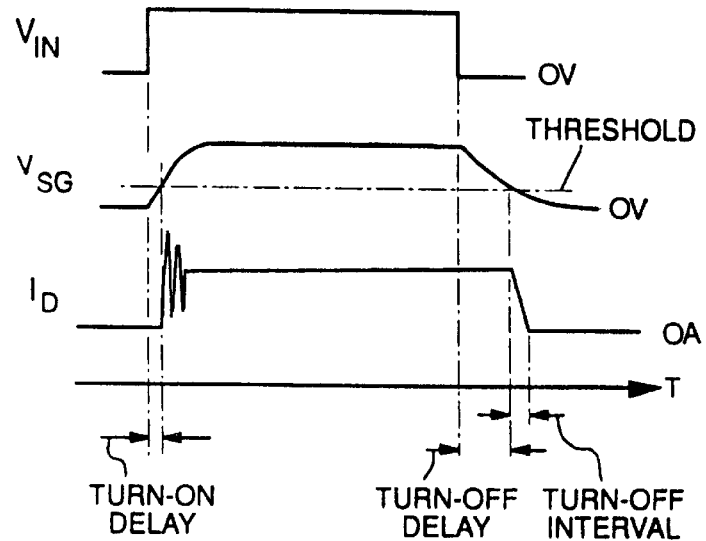
FIG. 2 is a set of waveforms characterizing the properties of the modulator of FIG. 1.
Figure 3:
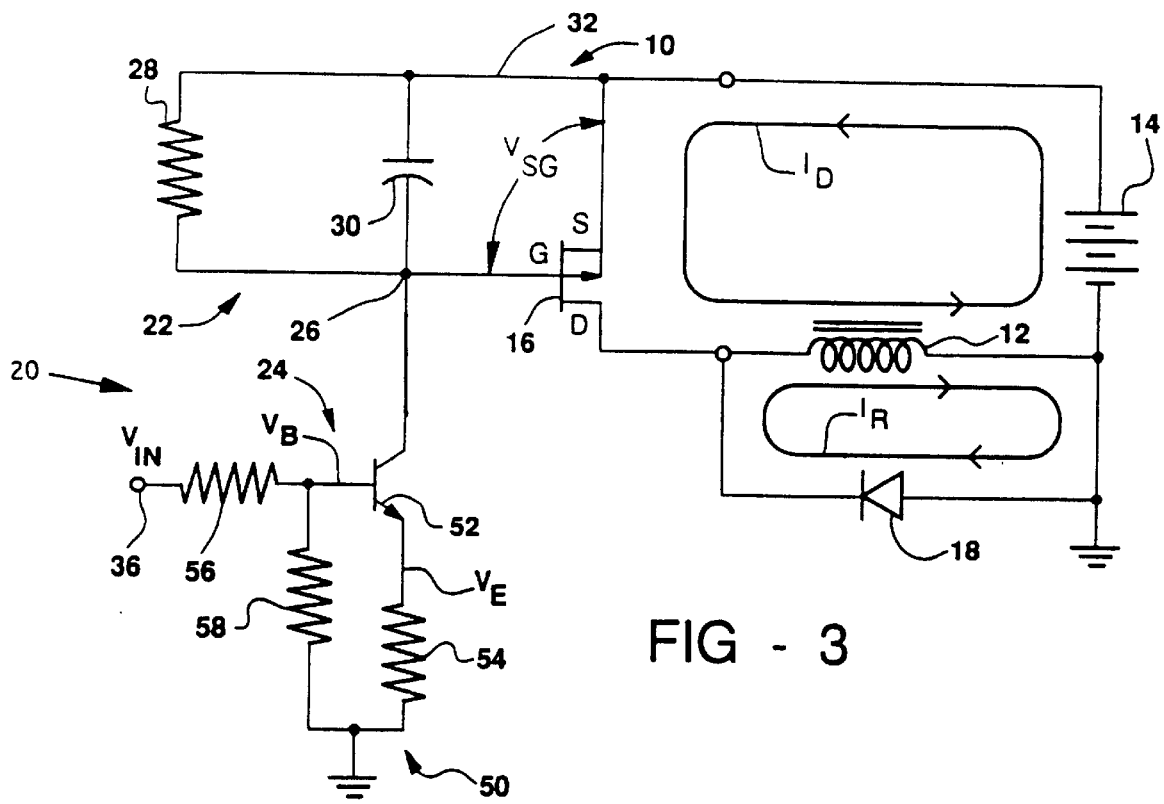
FIG. 3 is a schematic diagram of a pulsed modulator according to the invention.

Referring to FIG. 3, the driver 16 and load circuit are the same as in FIG. 1, and the waveshaping circuit 22 including the resistor 28 and the capacitor 30 are also the same. The input circuit comprises a constant current source 50 coupled at the node 26 between the waveshaping circuit and ground. The constant current source 50 comprises a transistor 52 having its collector connected to the node 26, its emitter coupled through a resistor 54 to ground, and its base coupled through a resistor 56 to the input terminal 36 and through a resistor 58 to ground. Input current flowing through the voltage divider comprising resistors 56 and 58 establish a base voltage $V_B$, the base current being small enough to be ignored. Preferably the resistors 56 and 58 are about equal so that the base voltage $V_B$ will be half the input voltage at terminal 36. The emitter voltage $V_E$ will be a base emitter drop $V_{BE}$ below the base voltage $V_B$ and the current $I_{CCS}$ through the resistor 54 is established by the emitter voltage divided by the resistor 54 value. Assuming that the input signal on terminal 36 alternates between ground and a fixed voltage (5 volts) the current $I_{CCS}$ will be alternating between zero and a constant value and is independent of the supply voltage on line 32 over a very wide voltage range.

Figure 4:
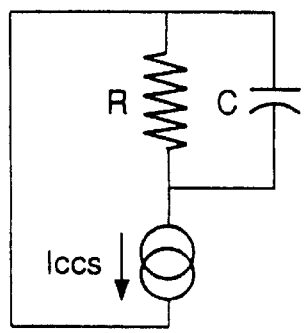
FIGS. 4, 5 and 6 are equivalent circuits illustrating the operation of the circuit of FIG. 3.
Figure 5:
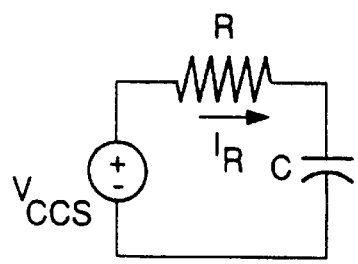

The effect of a constant current source used to charge a capacitor which is paralleled to a resistor is that the source appears to the capacitor as a voltage source and resistor in series; this is known as the Thevenin/Norton transformation. Keeping in mind that for purposes of AC analysis the supply line and ground are the same, the predriver equivalent circuit is a constant current source with current $I_{CCS}$ connected across the parallel resistor R and capacitor C combination as shown in FIG. 4. The transformation yields the FIG. 5 circuit showing a voltage source $V_{CCS}$ in series with the resistor R and the capacitor C.

Figure 6:
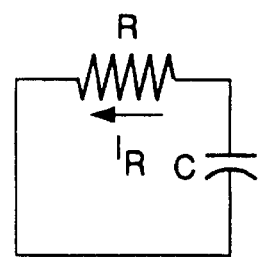

The voltage source has a value of $V=R*I_{CCS}$ and at turn-on charges the capacitor with a current $I_R$. When the current source turns off, then the equivalent voltage source goes to zero, and the R and C are simply a series circuit, discharging the capacitor with the current $I_R$, as shown in FIG. 6. Thus, the capacitor charges with an RC time constant determined by the same impedance R as it discharges through at turn-off, resulting in waveform symmetry, and allowing driver current slew rate to be the same at turn-on and turn-off.

Figure 7:
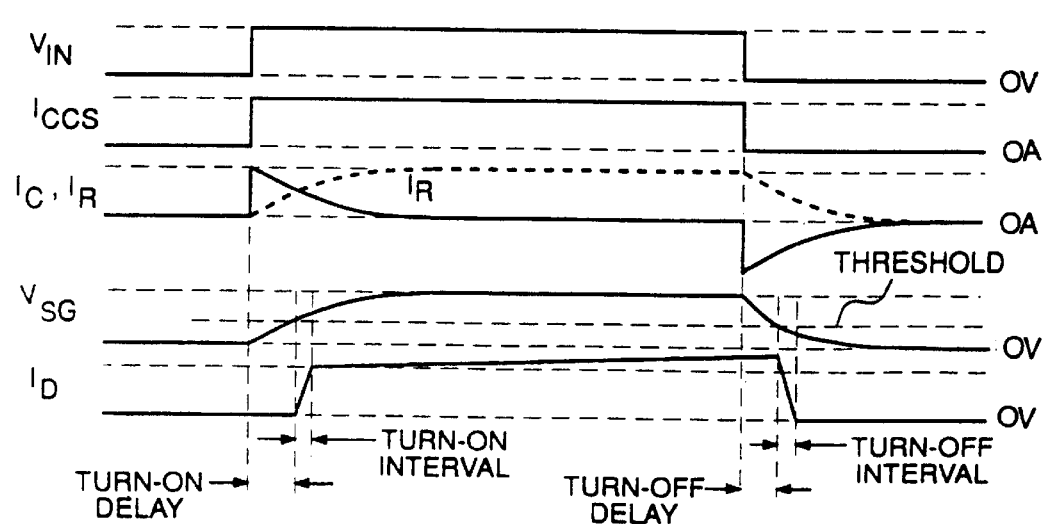
FIG. 7 is a set of waveforms showing the operation of the circuit of FIG. 3.

As shown in the waveforms of FIG. 7, when the input signal is high the constant current $I_{CCS}$ is on. Of principle interest is that at turn-on of the driver, the capacitor current $I_C$ is limited to $I_{ccs}$; then $I_C$ diminishes as the control voltage $V_{GS}$ increases and $I_R$ increases to a maximum value of $I_{CCS}$, resulting in a gradual turn-on of the FET driver 16 and a driver current $I_D$ having a fixed slew rate. At turn-off, the capacitor discharges through the resistor 28 initially at the current $I_{CCS}$, and the capacitor voltage decreases at the same rate as the increase rate at turn-on, resulting in a driver current turn-off slew rate equal the turn-on slew rate. The resulting symmetry of the driver current pulse leads to nearly equal turn-on and turn-off delays as well as nearly equal turn-on and turn-off intervals.

A second advantage of the improved circuit is that by properly selecting the value of the constant current $I_{CCS}$, the maximum voltage applied across the FET gate and source is held at a safe value; then the Zener diode 44 of the FIG. 1 circuit is no longer necessary, reducing the cost of the modulator.

The end result is that by incorporating the constant current source the component values can be selected to minimize the RFI. In practice acceptable noise levels are obtained by the improved circuit and at less cost than the prior art circuit. It is also possible to include a capacitor at the power supply input (line 32) for additional RFI reduction, if required by the RFI standards. Since the delay times are substantially equal at each end of the driver current pulse there is virtually no pulse stretching and the dynamic duty cycle range of the modulator is not reduced.

The embodiments of the invention in which an exclusive property or privilege is claimed are defined as follows:

1. A waveshaping predriver for a voltage controlled power transistor for producing output pulses in response to input pulses applied to said predriver, said predriver comprising:
    a constant current source which is turned on and off by said input pulses for producing a control signal coupled to the power transistor for turning the power transistor on and off for each input pulse; and
    a waveshaping circuit for limiting said control signal to a predetermined rate of change at turn-on and turn-off including a resistor and capacitor combination coupled to said constant current source such that said capacitor (1) is charged through said constant current source at a rate determined by said resistor when said current source is turned on to establish a desired turn-on slew rate of said output pulses, and (2) is discharged through said resistor when said current source is turned off to establish a turn-off slew rate of said output pulses which matches said desired turn-on slew rate.

2. The invention as defined in claim 1 wherein:
    said resistor and capacitor are connected in parallel between a power supply line and a control node;
    said constant current source is coupled between said control node and ground such that the sum of resistor and capacitor currents comprise the constant current of said constant current source when said constant current source is on; and
    said node is coupled to said power transistor, whereby the node voltage comprises said control signal.

3. The invention as defined in claim 1 wherein:
    said waveshaping circuit and said constant current source are serially coupled across a supply line and ground.

4. The invention as defined in claim 1 wherein:
    said waveshaping circuit and said constant current source are serially coupled across a supply line and ground to define a node;
    said node is connected to said power transistor, the voltage at said node forming said control signal; and
    said waveshaping circuit includes a resistor in parallel with a capacitor such that constant current from said constant current source flows through both said resistor and said capacitor to shape said control signal upon turn-on of said constant current source.

5. The invention as defined in claim 1 wherein:

said waveshaping circuit and said constant current source are serially coupled across a supply line and ground to define a node;

said node is connected to said power transistor, the voltage at said node forming said control signal; and said waveshaping circuit includes a resistor in parallel with a capacitor such that said capacitor charges through said constant current source at a desired rate determined by said resistor upon turn-on of said constant current source and said capacitor discharges through said resistor at said desired rate upon turn-off of said constant current source.

* * * * *